United States Patent
Chiu

(10) Patent No.: US 7,368,956 B2
(45) Date of Patent: May 6, 2008

(54) DATA SLICER WITH A SOURCE-DEGENERATION STRUCTURE

(75) Inventor: Chang-Ming Chiu, Taipei (TW)

(73) Assignee: Richwave Technology Corp., Taipei (TW)

(*) Notice: Subject to any disclaimer, the term of this patent is extended or adjusted under 35 U.S.C. 154(b) by 159 days.

(21) Appl. No.: 11/098,494

(22) Filed: Apr. 5, 2005

(65) Prior Publication Data
US 2006/0152252 A1 Jul. 13, 2006

(30) Foreign Application Priority Data
Jan. 11, 2005 (TW) .............................. 94100781 A

(51) Int. Cl.
*H03K 5/153* (2006.01)
(52) U.S. Cl. ..................... 327/60; 348/465
(58) Field of Classification Search ................. 327/60; 348/465
See application file for complete search history.

(56) References Cited

U.S. PATENT DOCUMENTS

| | | | |
|---|---|---|---|
| 4,115,811 A * | 9/1978 | Goff | 348/622 |
| 4,400,732 A * | 8/1983 | Watanabe et al. | 348/622 |
| 4,667,235 A * | 5/1987 | Nozoe et al. | 348/464 |
| 5,436,934 A * | 7/1995 | Co | 375/351 |
| 6,069,499 A * | 5/2000 | Cho et al. | 327/58 |
| 6,734,918 B2 | 5/2004 | Inoue | |
| 6,735,260 B1 * | 5/2004 | Eliezer et al. | 375/316 |
| 6,912,009 B2 * | 2/2007 | Umetani | 348/465 |
| 7,184,494 B2 * | 2/2007 | Umetani | 375/324 |

* cited by examiner

*Primary Examiner*—Kenneth B. Wells
(74) *Attorney, Agent, or Firm*—Rosenberg, Klein & Lee

(57) ABSTRACT

A data slicer with a source-degeneration structure is described. In particular, this invention can be implemented in a FM demodulation system. It located at the end of the demodulator. The data slicer can slice a signal transmitted through air and demodulates the same with a demodulator to produce a frequency-shifted modulation (FSK) signal. The signal is a perfect square-wave and is transmitted to a base band circuit. The data slicer with a source-degeneration structure obtains the exact reference voltage. The reference voltage is not affected by noise and doesn't need the coupling capacitor, so it can reduce the difficulty of manufacture and cost. The present invention has a common-source unit with a source-degeneration resistor for producing an input signal and a reference voltage, and a comparator unit for comparing the input signal and the reference voltage and outputting a square-wave signal that corresponds to the input signal.

4 Claims, 5 Drawing Sheets

DATA SLICER WITH A SOURCE-DEGENERATION STRUCTURE

BACKGROUND OF THE INVENTION

1. Field of the Invention

The present invention relates to a data slicer with a source-degeneration structure. In particular, this invention can be implemented in a FM demodulation system. It is located at the end of the demodulator, the data slicer can slice a signal transmitted through air and demodulate the same with a demodulator to produce a frequency-shifted modulation (FSK) signal. The signal is a perfect square-wave and is provided to a base band circuit.

2. Description of the Related Art

The image data or the data transmitted by a digital method is modulated to a square-wave signal before the signal is transmitted and is transmitted to the receiver through a specified medium. Usually, the high frequency signal is deformed after the frequency-shifted modulation (FSK) signal is transmitted by the air and is demodulated by the demodulator. The reference voltage of the modulation signal is not correctly obtained because the modulation signal is deformed and the circuit can't produce a square-wave with a 50% duty cycle. Therefore, the data slicer needs to produce a perfect square-wave signal for the base band circuit later.

FIG. 1 shows a conventional data slicer that uses a pluirality of series resistors to produce a reference voltage. The data slicer comprises a plurality of resistors $R_{11}$, $R_{12}$, $R_{13}$, $R_{1n}$, a bias-voltage threshold switching apparatus 10 and a buffer 12 comprising an amplifier. The drawbacks are that the bias-voltage of the output signal is needed and the reference voltage is not located in the center level when the input signal is small.

FIG. 2 shows a prior circuit that uses a received signal spectrum detecting (RSSI) circuit and a low pass filter to obtain an average value of the input signal as well as a reference voltage for a data slicer. The circuit comprises a received signal spectrum detecting (RSSI) circuit 16, a resistor $R_{21}$ and a capacitor $C_{21}$. The drawback is that the circuit averages the signal and the noise signal when the signal is small and increases the reference voltage.

FIG. 3 shows a prior circuit that uses a received signal spectrum detecting (RSSI) circuit to obtain the spectrum of the input signal and subtracts 6 dB to provide a reference voltage. This is called a peak detector method. The circuit comprises a RSSI circuit 20, a capacitor $C_{31}$ and a decreasing 6 dB circuit including a transistor $T_{31}$, a resistor $R_{d1}$ and a current source $I_{d1}$. The drawback is that the method detects the disturbance peak and sees it as a high level when the low level signal has a disturbance peak. Therefore, the method obtains the wrong reference voltage.

U.S. Pat. No. 6,734,918, entitled "Data Slicer Circuit", provides a data slicer circuit, and is illustrated in FIG. 4. The data slicer comprises a capacitor $C_1$ for receiving the image signal, a clamping circuit 24 for receiving the image signal by a current coupling method, a first settle capacitor $C_2$ for holding the voltage of the image signal, a second settle capacitor $C_3$ for obtaining the average voltage of the image signal within a fixed period and holding the average voltage, a comparator 26 for comparing the above two holding voltage and outputting a signal when the holding voltage of the second capacitor $C_3$ is greater than the holding voltage of the first capacitor $C_1$. However, this method needs a coupling capacitor to prevent the direct voltage of the front end from affecting the operation voltage of data slicer. At the same time, the capacitor value is big for preventing signal deformation, and this will increase the difficulty of manufacture of the IC and require a large capacitor. Besides, this method obtains the reference voltage by charging and discharging the capacitor. The above method obtains the wrong reference voltage when the circuit deals with a high frequency signal due to the capacitor charging and discharging incompletely.

SUMMARY OF THE INVENTION

The main purpose of the present invention is to provide a data slicer with a source-degeneration structure. In particular, this invention can be implemented in an FM demodulation system. It is located at the end of the demodulator. The data slicer can slice a signal transmitted through air and demodulate the same with the demodulator to produce a frequency-shifted modulation (FSK) signal. The signal is a perfect square-wave and is provided to a base band circuit. The data slicer with a source-degeneration structure of the invention obtains the exact reference voltage, is not affected by noise signals, and doesn't need the coupling capacitor, so it can reduce the difficulty of manufacture and cost.

In order to achieve the above goal, the data slicer with a source-degeneration structure of the present invention comprises a common-source unit with a source-degeneration resistor for providing an input signal and producing a reference voltage of the input signal, and a comparator unit that connects to the common-source unit with a source-degeneration resistor for comparing the input signal and the reference voltage of the input signal and outputting a square-wave signal that corresponds to the input signal.

The common-source unit with a source-degeneration resistor comprises two input ports and two output ports. The input signal is inputted in the first input port. The first output port connects a resistor and a capacitor in parallel to obtain a reference voltage provided to the comparator unit. The input signal also is inputted into the second input port through a resistor. The common-source unit with a source-degeneration resistor further comprises a drain-port resistor and a source-port resistor.

The present invention also provides a method of obtaining the reference voltage for the data slicer with a source-degeneration structure. The method comprises the following steps. A raw signal is input. The input signal is processed by a common-source circuit with a source-degeneration resistor to obtain an output signal and a reference voltage of the output signal. The output signal and the reference voltage of the output signal are processed by a comparator to output a square-wave signal. A level shift voltage is provided by a hysteresis feedback circuit to reduce the effect due to the high frequency noise on near the reference voltage. The direct level of the output signal is shifted according to the level shift voltage and compared with the reference voltage of the output signal to obtain a square-wave signal. The jitter of the square-wave signal is thereby reduced.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
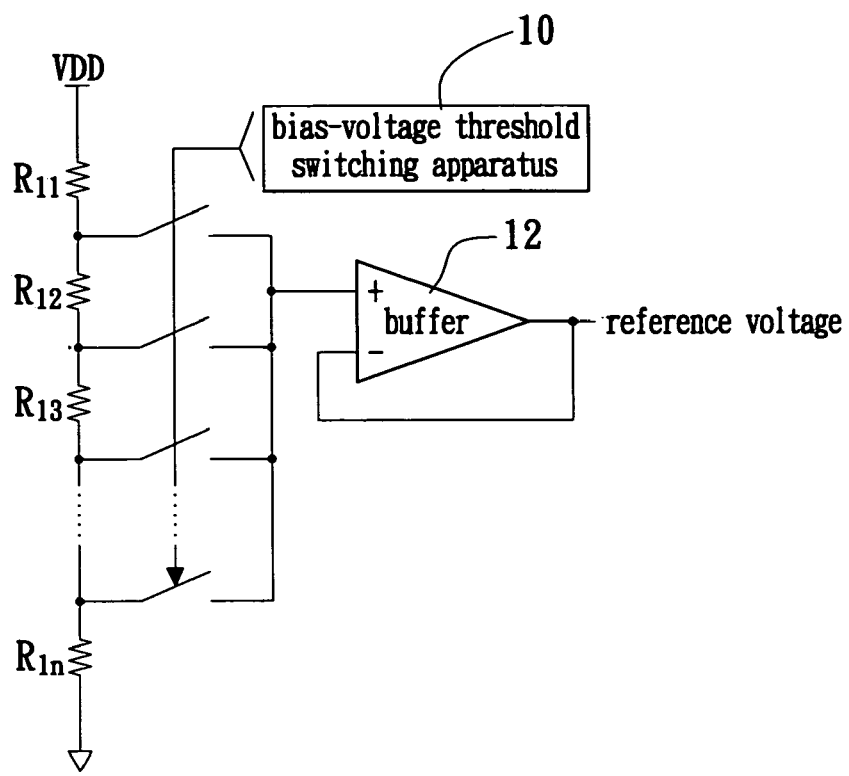
FIG. 1 is a circuit diagram of the prior art utilizing the serial resistors to produce a reference voltage.
Figure 2:
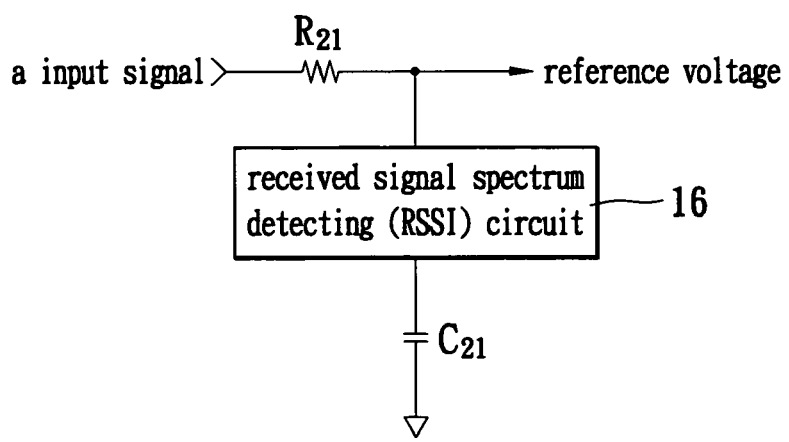
FIG. 2 is a circuit diagram of the prior art utilizing a received signal spectrum detecting (RSSI) circuit and a low pass filter to obtain an average value of the input signal used as a reference voltage for a data slicer.
Figure 3:
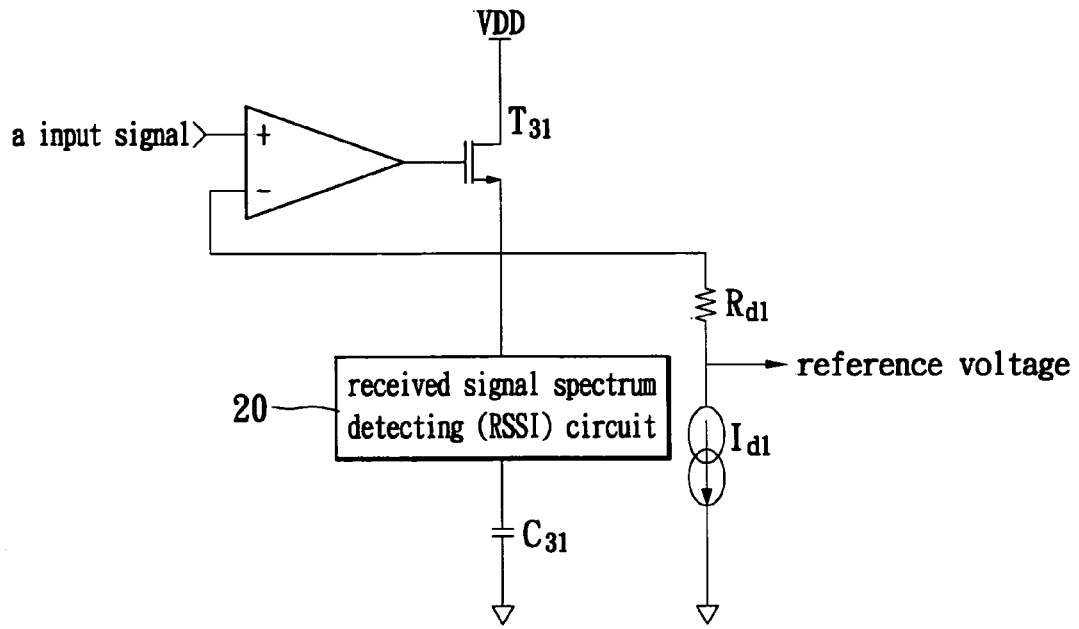
FIG. 3 is a circuit diagram of the prior art utilizing a received signal spectrum detecting (RSSI) circuit to obtain the spectrum of the input signal and subtract 6 dB for use as a reference voltage.
Figure 4:
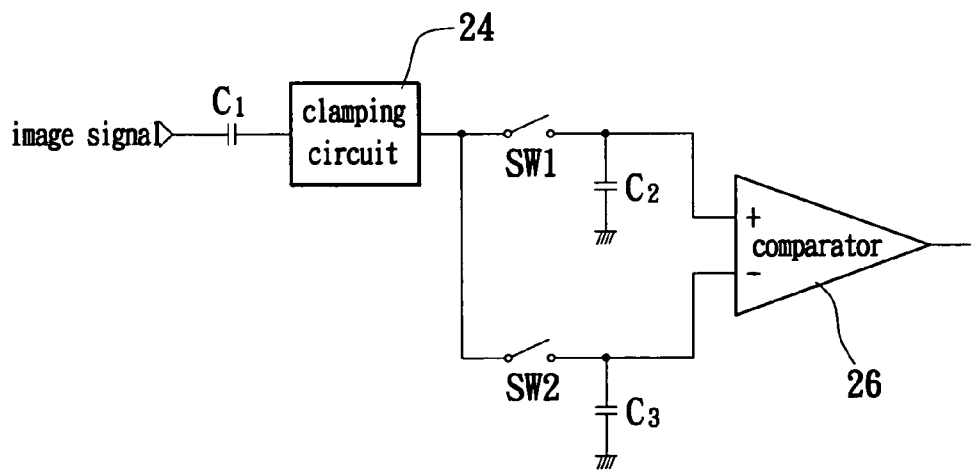
FIG. 4 is a circuit diagram of the prior art data slicer circuit.
Figure 5:
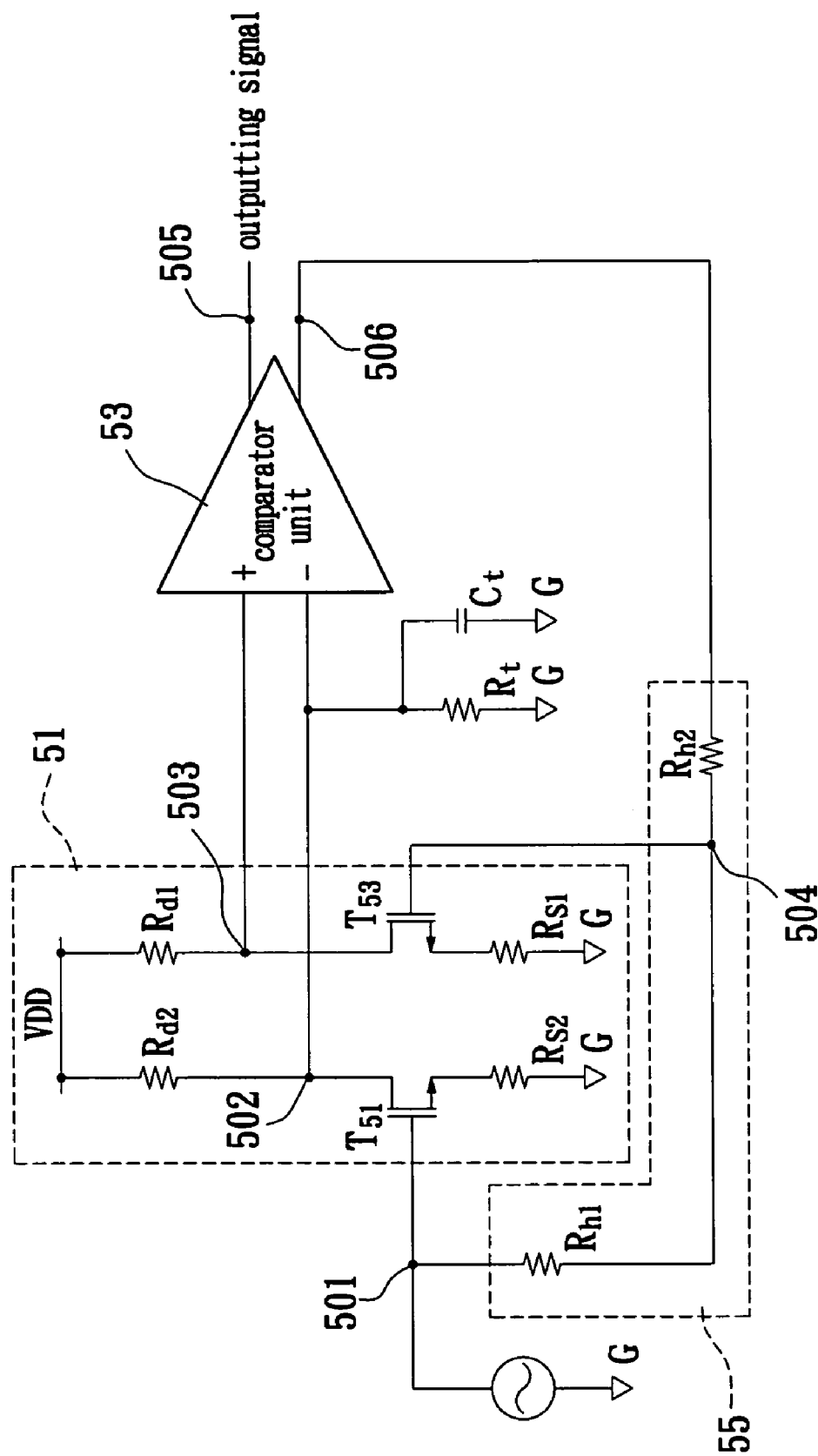
FIG. 5 is a circuit diagram of the data slicer with a source-degeneration structure according to the present invention.

Reference is made to FIG. 5, which shows a circuit diagram of the embodiment of the present data slicer with a source-degeneration structure. The present data slicer with a source-degeneration structure comprises a common-source unit with a source-degeneration resistor 51 for providing an input signal and producing a reference voltage of the input signal. A comparator unit 53 connects to the common-source unit with a source-degeneration resistor 51 for comparing the input signal and the reference voltage of the input signal and outputting a square-wave signal that corresponds the input signal.

The common-source unit with a source-degeneration resistor 51 comprises two input ports 501, 504 and two output ports 502, 503. The input signal is inputted in the first input port 501. The first output port 502 connects a resistor $R_t$ and a capacitor $C_t$ in parallel to obtain a reference voltage provided to the comparator unit 53. The first output port 502 also can serially connect a resistor and a capacitor to obtain a reference voltage provided to the comparator unit 53. The input signal also is inputted into the second input port through a resistor. In order to obtain a direct level as a reference voltage, the time constant composed by the above resistor and capacitor needs to be appropriately set according to the frequency of the signal. The time constant is big when the frequency of the signal is low; the time constant is small when the frequency of the signal is high. The input signal is inputted into the second input port 504 through a resistor $R_{h1}$. The common-source unit with a source-degeneration resistor 51 is composed by two metal oxide semiconductor field-effect transistors (MOSFET). This invention can obtain the reference voltage according to the input signal immediately.

The comparator unit 53 is composed by a N-MOS. The invention can operate when the input signal is bigger than the cutting voltage of the N-MOS. Therefore, the present data slicer with a source-degeneration structure has a wide dynamic range.

The common-source unit with a source-degeneration resistor 51 is saturated when the gain is too big. The signal-to-noise ratio will be small when the gain is too small. In order to solve the above problem, the common-source unit with a source-degeneration resistor 51 further comprises drain-port resistors $R_{d1}$, $R_{d2}$ and source-port resistors $R_{s1}$, $R_{s2}$. The ratio of the drain-port resistors $R_{d1}$, $R_{d2}$ and the source-port resistors $R_{s1}$, $R_{s2}$ need to be appropriately adjusted. When the ratio of the drain-port resistors $R_{d1}$, $R_{d2}$ and the source-port resistors $R_{s1}$, $R_{s2}$ are set to 1:1, the original signal amplitude is maintained.

The comparator unit 53 has a positive output port 505 and a negative output port 506 that can feed back two square-wave signals to the input ports 501, 504 of the common-source unit with a source-degeneration resistor 51 to be a hysteresis. When the phase of the input signal is same as the phase of the output signal of the comparator unit 53, the output signal is fed back to the second output port 504 of the common-source unit with a source-degeneration resistor 51 as positive feedback. When the phase of the input signal has an 180 degree difference with the phase of the output signal of the comparator unit 53, the output signal is fed back to the second output port 504 of the common-source unit with a source-degeneration resistor 51 as negative feedback. The hysteresis can reduce the jitter caused by the high frequency signal loaded on the input signal, especially near the reference voltage.

The data slicer with a source-degeneration structure according to the present invention further comprises a hysteresis unit 55 for reducing the jitter caused by the high frequency signal loaded on the input signal, especially near the reference voltage. Two resistors $R_{h1}$, $T_{h2}$, compose the hysteresis unit 55. It can be a negative hysteresis by a negative feedback or a positive hysteresis by a positive feedback.

Figure 6A:
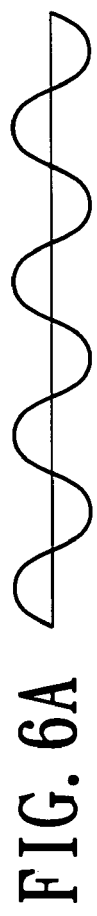
FIGS. 6A-6F are signal timing diagrams of the data slicer with a source-degeneration structure according to the present invention.
Figure 6B:
Figure 6C:
Figure 6D:
Figure 6E:
Figure 6F:
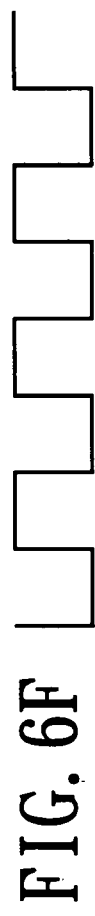

FIGS. 6A-6F are signal-timing diagrams of the present data slicer with a source-degeneration structure. FIG. 6A is a signal-timing diagram of the first input port 501. FIG. 6B is a signal-timing diagram of the first output port 502. FIG. 6C is a signal-timing diagram of the second output port 503 without the hysteresis unit 55. FIG. 6D is a signal-timing diagram of the second output port 503 with the hysteresis unit 55. FIG. 6E is a signal-timing diagram of the negative output port 505 of the comparator unit 53. FIG. 6F is a signal-timing diagram of the positive output port 506 of the comparator unit 53. The operating principle can be easily understood from the above signal-timing diagrams.

Figure 7:
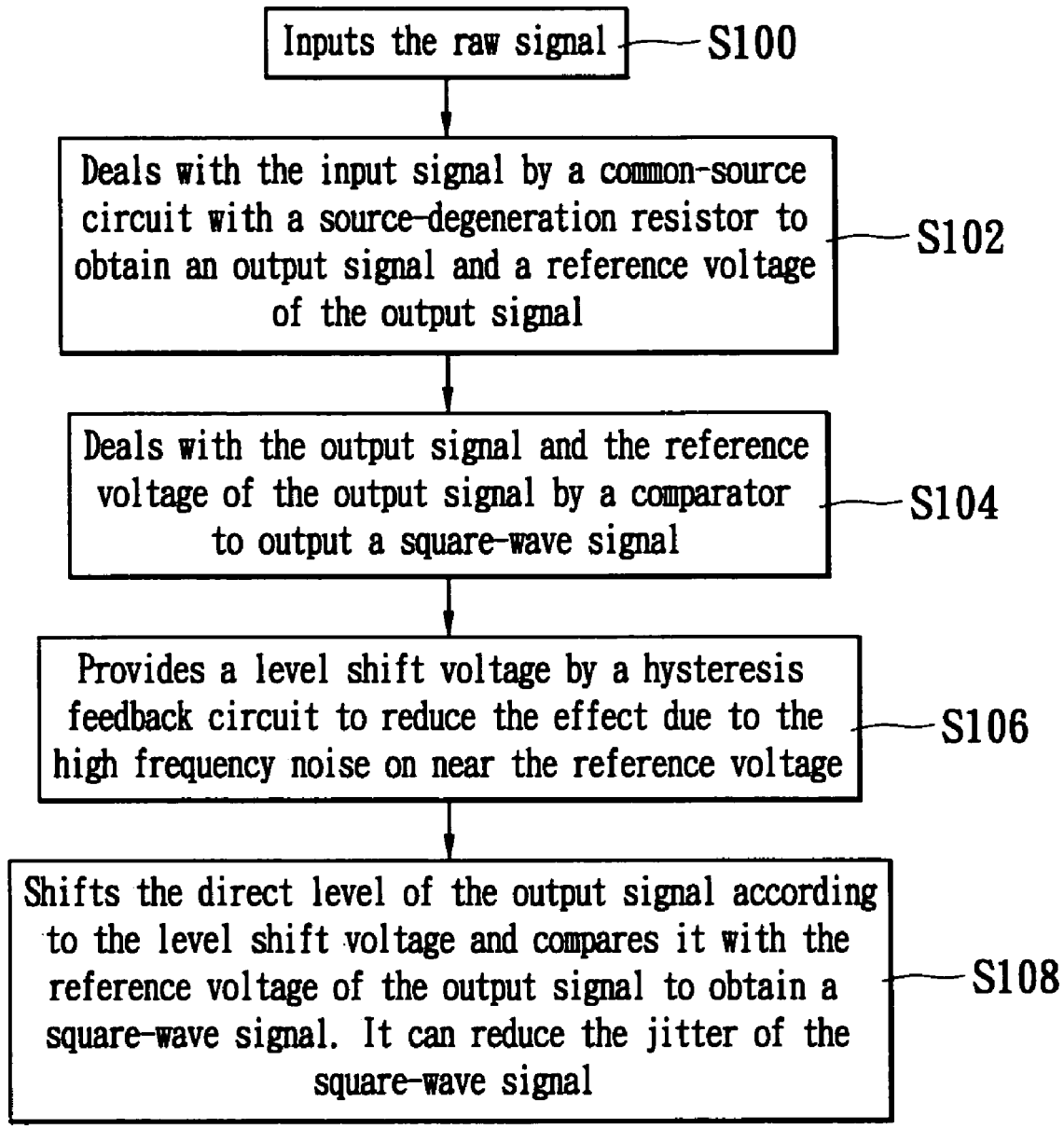
FIG. 7 is a flow chart of obtaining a square-wave signal by using the data slicer with a source-degeneration structure according to the present invention.

The present invention also provides a method of obtaining the reference voltage for the data slicer with a source-degeneration structure. Reference is made to FIG. 7, which shows a flow chart of obtaining the reference voltage for the data slicer with a source-degeneration structure. The method comprises the following steps. The raw signal is input (S100). The input signal is processed by a common-source circuit with a source-degeneration resistor to obtain an output signal and a reference voltage of the output signal (S102). This means the characteristic of the common-source circuit with a source-degeneration resistor is used to obtain an output signal and a reference voltage of the output signal. The output signal and the reference voltage of the output signal are processed by a comparator to output a square-wave signal (S104). The square-wave signal has the duty cycle of 50%. A level shift voltage is provided by a hysteresis feedback circuit to reduce the effect due to the high frequency noise on near the reference voltage (S106). The direct level of the output signal is shifted according to the level shift voltage and compared with the reference voltage of the output signal to obtain a square-wave signal (S108).

The jitter of the square-wave signal is thereby reduced.

The data slicer with a source-degeneration structure has the following characteristics:

1. The coupling capacitor is not needed anymore. This can reduce the manufacturing difficulty, cost and pin number of the integrated circuit.

2. The exact reference voltage can be obtained by averaging the input signal through the output signal of the common-source unit with a source-degeneration resistor.

3. The reference voltage is not affected by noise signals. The high and low levels are higher than the noise. The average value of the noise signal is far less than the reference voltage.

4. When the coupling capacitor is small, the low frequency signal will be deformed. Because the present invention omits the coupling capacitor, the signal passed through the common-source unit with a source-degeneration resistor loses no information. The common-source unit with a source-degeneration resistor will not be affected by the loading of the front stage circuit. It is very suitable for the demodulation signal.

5. The common-source unit with a source-degeneration resistor has a wide dynamic range. It can operate when the output voltage of the front stage circuit is higher than the cutting voltage of the common-source unit with a source-degeneration resistor.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A data slicer with a source-degeneration structure, comprising:

a common-source unit with a source-degeneration resistor, for providing an input signal and producing a reference voltage of the input signal, wherein the common-source unit with the source-degeneration resistor has two input ports and two output ports, the first input port being used for inputting a signal, the first output port connecting a resistor and a capacitor in parallel to obtain a reference voltage;

a comparator unit, connecting to the common-source unit with the source-degeneration resistor, the reference voltage of the input signal being provided to the comparator unit, the comparator unit comparing the input signal and the reference voltage of the input signal, and outputs a square-wave signal corresponding to the input signal; and a hysteresis unit for reducing a jitter caused by a high frequency signal loaded on the input signal.

2. The data slicer with a source-degeneration structure of claim 1, wherein the hysteresis unit comprises two resistors.

3. The data slicer with a source-degeneration structure of claim 1, wherein the hysteresis unit provides a negative hysteresis by adopting a negative feedback.

4. The data slicer with a source-degeneration structure of claim 1, wherein the hysteresis unit provides a positive hysteresis by adopting a positive feedback.

* * * * *